United States Patent [19]

Macomber et al.

[11] Patent Number: 5,610,930
[45] Date of Patent: Mar. 11, 1997

[54] VOLTAGE ADDING DIODE LASER ARRAY

[75] Inventors: Steven H. Macomber, Newtown; Patricia A. Lee, Brookfield, both of Conn.

[73] Assignee: Hughes Aircraft Company, Los Angeles, Calif.

[21] Appl. No.: 397,589

[22] Filed: Mar. 2, 1995

[51] Int. Cl.$^6$ .................................................. H01S 3/025
[52] U.S. Cl. ................................ 372/36; 372/35; 372/38; 372/109
[58] Field of Search ........................ 372/36, 38, 109, 372/35

[56] References Cited

U.S. PATENT DOCUMENTS

| | | | |
|---|---|---|---|
| 5,040,187 | 8/1991 | Karpinski | 372/50 |
| 5,081,639 | 1/1992 | Snyder et al. | 372/101 |
| 5,084,886 | 1/1992 | Martin | 372/75 |
| 5,105,429 | 4/1992 | Mundinger et al. | 372/36 |
| 5,238,531 | 8/1993 | Macomber et al. | 156/643 |
| 5,241,556 | 8/1993 | Macomber et al. | 372/96 |
| 5,251,098 | 10/1993 | Schmidt | 257/718 |
| 5,345,466 | 9/1994 | Macomber | 372/96 |

OTHER PUBLICATIONS

L. S. Goldmann et al, "Lead–Indium for Joining a Semiconductor Chip to a Substrate," IBM Technical Disclosure Bulletin, vol. 16, No. 11, Apr. 1974 pp. 3610–3611.

"Recent Developments in Surface Emitting Distributed Feedback Arrays", S. Macomber et al., Proc., SPIE, vol. 1219, pp. 228–232, 1990 (No month).

"Two–Dimensional Surface Emitting Distributed Feedback Laser Arrays", J. S. Mott et al., IEEE Photon, Lett., vol. 1, pp. 202–204, 1989, Aug.

"Surface–Emitting Distributed Feedback Semiconductor Laser", S. Macomber et al., Appl. Phys. Lett. 51(7) pp. 472–474, Aug. 1987.

Primary Examiner—James W. Davie
Attorney, Agent, or Firm—W. C. Schubert; W. K. Denson-Low

[57] ABSTRACT

An array (10) of diode lasers (12) is comprised of a substrate (22) having a plurality of electrically conductive surface areas (24, 24a, 24b, 24c) and a plurality of diode laser subassemblies (20) individual ones of which are conductively coupled to one of the plurality of surface areas (24a). Each of the diode laser subassemblies includes a diode laser (12), preferably a SE-DFB diode laser, that is conductively coupled to and mounted upon a first surface of an electrically conductive body or submount (14). The submount has a second opposite surface that is electrically coupled to and mounted upon one of the electrically conductive areas, preferably with a layer (25) of compliant, deformable material such as indium foil or an indium alloy. The individual diode lasers are preferably electrically connected in a series, voltage adding configuration. The substrate further includes a plurality of electrical conductors for connecting to individual ones of the diode lasers such that a current flow can be established through a single diode laser. This facilitates the alignment process, and also enables individual diode lasers to be selectively energized. For each of the subassemblies there is provided at least one electrically conductive clamping member (26, 28, 30) for compressively urging the submount towards the substrate and for also coupling a current flow to the diode laser. A predetermined number of the subassemblies are arranged in a linear pattern on the substrate, and a lens (34) is disposed relative to the diode lasers in the linear pattern for collimating an output beam from individual ones of the diode lasers. A cylindrical lens is a presently preferred embodiment for the collimating lens.

20 Claims, 8 Drawing Sheets

VOLTAGE ADDING DIODE LASER ARRAY

FIELD OF THE INVENTION

This invention relates generally to sources of electromagnetic radiation and, more specifically, to arrays of semiconductor diode lasers.

BACKGROUND OF THE INVENTION

The use of semiconductor diode lasers (hereinafter referred to simply as diode lasers) for forming a source of optical energy is attractive for a number of reasons. For example, diode lasers have a relatively small volume and consume a small amount of power as compared to conventional laser devices. Also by example, the diode laser is a monolithic device, and does not require a combination of a resonant cavity with external mirrors and other structures to generate a coherent output beam.

One disadvantage of the semiconductor diode laser is the relatively low power of the output beam, as compared to other types of laser devices.

In an attempt to increase the output power, while still preserving the advantages of the diode laser, researchers have combined a plurality of individual semiconductor diode lasers into arrays. In this approach the total output power becomes a function of the number of individual diode lasers that comprise the array.

One such approach is referred to in the art as a 'rack and stack' configuration. In the rack and stack configuration a bar comprised of a plurality of side-by-side edge emitting Fabry-Perot diode lasers is sandwiched between two electrically conductive buses that provide DC operating power to the laser diodes of the bar. A number of bars can be vertically stacked in this manner, yielding a two dimensional array of individual Fabry-Perot diode lasers.

A related approach is referred to in the art as 'bars and grooves', wherein an electrically insulating substrate has a plurality of parallel grooves into which are inserted bars comprised of the plurality of side-by-side edge emitting Fabry-Perot diode lasers. The bars can be soldered into place and thus both mechanically stabilized and electrically connected to a power bus. U.S. Pat. No. 5,040,187, entitled "Monolithic Laser Diode Array" by A. Karpinski, is representative of this approach.

One problem that arises in either of these approaches is the use of the conventional edge cleaved and edge emitting Fabry-Perot type of diode laser. This type of diode laser exhibits severe alignment constraints (i.e., exhibits submicron tolerances) when it is desired to optically couple the array to an external lens, such as a collimating lens. Similar problems exist when using monolithic arrays of 45° mirror type surface emitting lasers.

A more attractive type of diode laser is known as the vertical or surface emitting (SE) type, wherein the output beam is emitted through a window from the 'top' of the diode laser, as opposed to being emitted from a cleaved edge as in the Fabry-Perot. Distributed feedback (DFB) can be employed within the diode laser to provide a resonant cavity structure. The following U.S. Patents are all representative of surface emitting DFB (SE-DFB) diode lasers: U.S. Pat. No. 5,345,466 (Sep. 6, 1994) entitled "Curved Grating Surface-Emitting Distributed Feedback Laser" by S. H. Macomber (an inventor of this patent application); U.S. Pat. No. 5,241,556 (Aug. 31, 1993) entitled "Chirped Grating Surface-Emitting Distributed Feedback Semiconductor Lasers" by S. H. Macomber and J. S. Mott; and U.S. Pat. No. 5,238,531 (Aug. 24, 1993) entitled "Apparatus and Method for Fabricating a Chirped Grating in a Surface-Emitting Distributed Feedback Semiconductor Laser Diode Device by S. H. Macomber and J. S. Mott. Reference may also be had to following publication: S. H. Macomber et al., "Surface-emitting distributed feedback semiconductor laser", Appl. Phys. Lett., vol. 51, pp.472–474, 1987.

Of particular interest herein are the following two publications, both of which were coauthored by an inventor of this patent application. These two publications report on arrays of SE-DFB diode lasers: S. H. Macomber et al., "Recent developments in surface emitting distributed feedback arrays", Proc. SPIE, vol. 1219, pp. 228–232, 1990; and J. S. Mott et al., "Two-dimensional surface emitting distributed feedback laser arrays", IEEE Photon. Lett., vol. 1, pp. 202–204, 1989. Both of these publications describe the mechanical and electrical combination of a chip containing a plurality of SE-DFB diode lasers with a water cooled copper/silicon microchannel supporting structure and heat sink.

One problem presented by conventional approaches to array fabrication is a difficulty in providing an array of SE-DFB diode lasers that are prescreened and burned-in prior to being incorporated into the array.

In this regard it can be shown that if y is the probability that a single element of a monolithic array of diode lasers will operate to specification, then the probability P that an N-element monolithic array will have all diode lasers operating to specification is $P=y^N$. For example, in the case of a five element array of diode lasers, and assuming a typical process yield of y=0.5, the array yield is approximately only 3%. It can be appreciated that the probability of fabricating a totally functional larger array (e.g., a 64 element array) is essentially zero.

Another problem presented by conventional approaches is a difficulty in providing an array of SE-DFB diode lasers that can be individually selected and operated independently of the other diode lasers of the array. A further problem presented by conventional approaches is a difficulty in providing an array of SE-DFB diode lasers that can be individually selected and operated independently of the other diode lasers of the array, and which furthermore can have different output wavelengths.

A still further problem presented by conventional approaches is providing a voltage adding type of array, wherein individual ones of the diode lasers of the array are connected together in series as opposed to being connected in parallel. The provision of a series connected, 'voltage adding' array greatly simplifies the cabling and power supply requirements over a parallel connected array. For example, if each diode laser requires approximately 10 amperes at two volts to operate; a 64 element parallel connected array will require as a minimum a two volt, 640 ampere power supply. However, a 64 element series connected array will require instead, as a minimum, a 128 volt, 10 ampere power supply. It can be appreciated that at least the power supply and cabling for the latter configuration is significantly less of a problem to implement than the power supply and cabling for the former, parallel-connected embodiment.

SUMMARY OF THE INVENTION

The foregoing and other problems are overcome by a voltage adding, series connected array of diode lasers that is constructed, operated and aligned in accordance with the teaching of this invention.

An array of diode lasers is comprised of a substrate having a plurality of electrically conductive surface areas and a plurality of diode laser subassemblies individual ones of which are conductively coupled to one of the plurality of surface areas. The substrate is electrically insulating and is selected to have a sufficient thermal conductivity for removing heat from the subassemblies. One suitable material for the substrate is BeO.

Each of the diode laser subassemblies includes a diode laser, preferably a SE-DFB diode laser, that is conductively coupled to and mounted upon a first surface of an electrically conductive body or submount. The submount has a second opposite surface that is electrically coupled to and mounted upon one of the electrically conductive areas, preferably with a layer of compliant, deformable material such as indium foil. The individual diode lasers are preferably electrically connected in a series, voltage adding configuration. The substrate further includes a plurality of electrical conductors for connecting to individual ones of the diode lasers such that a current flow can be established through a single diode laser. This facilitates the alignment process, and also enables individual diode lasers to be selectively energized. This latter capability is important for a case where the diode lasers have different emission wavelengths, as wavelength multiplexing and other wavelength-dependent applications can be accomplished.

The first surface of each submount has mounted thereon at least one electrical insulator having an electrically conductive portion. A plurality of wirebonds are electrically coupled between the electrically conductive portion and the diode laser.

For each of the subassemblies there is provided at least one electrically conductive clamping member for compressively urging the submount towards the substrate and for also coupling a current flow to the diode laser.

A fluid cooled heat sink assembly is preferably coupled to a surface of the substrate that is opposite a surface to which the subassemblies are mounted, thereby enabling high power operation of the array.

A predetermined number of the subassemblies are arranged in a linear pattern on the substrate, and a lens is disposed relative to the diode lasers in the linear pattern for collimating an output beam from individual ones of the diode lasers. A cylindrical lens is a presently preferred embodiment for the collimating lens.

This invention also teaches a method for aligning an array of diode lasers. The method includes a first step of (a) providing a substrate having surface with a plurality of electrically conductive areas and a plurality of diode laser subassemblies. Individual ones of the subassemblies comprise a diode laser that is conductively coupled to and mounted upon a first surface of an electrically conductive body. A second opposite surface of individual ones of the conductive bodies is electrically coupled to one of the electrically conductive areas through a layer of compliant, deformable material.

Further steps of the method include: (b) passing a current through a diode laser of one of the subassemblies to cause the diode laser to emit a beam of electromagnetic radiation; collimating the emitted beam; (c) focussing the collimated beam to form a spot beam; (d) obtaining an image of the spot beam; and (e) while observing the image of the spot beam, applying a force to the subassembly to vary an orientation of the subassembly with respect to the surface of the substrate.

Preferably the diode lasers are connected together in series, and the step of applying a current applies a pulsed current to only a single one of the diode lasers at a time through connection paths that are independent of the serial current path through the diode lasers.

The step of focussing includes a step of applying the collimated beam to a Fourier transform lens that is positioned approximately one focal length from the array and approximately one focal length from a radiation sensitive element of a camera used to obtain the image of the spot beam.

BRIEF DESCRIPTION OF THE DRAWINGS

The above set forth and other features of the invention are made more apparent in the ensuing Detailed Description of the Invention when read in conjunction with the attached Drawings, wherein:

FIG. 4A is a side view taken along the longitudinal axis of a plurality of in-line SE-DFB diode lasers, while

FIG. 5A is a side view of a single SE-DFB diode laser, mounted on an electrically and thermally conductive compliant material, before an optical alignment process, while

FIGS. 7A–7D illustrate various exemplary images obtained with the video camera of FIG. 6, wherein

DETAILED DESCRIPTION OF THE INVENTION

This invention will be described in the context of presently preferred embodiments that employ SE-DFB diode lasers. In this regard the disclosures of the above-mentioned U.S. Pat. Nos. 5,345,466, 5,241,556, and 5,238,531 are incorporated by reference herein in their entireties for teaching methods to fabricate such diode lasers. It should be realized, however, that the teachings of this invention are not limited to only this one particular type of surface emitting diode laser, nor is the teaching of this invention limited for use only with surface emitting diode lasers.

Figure 1:
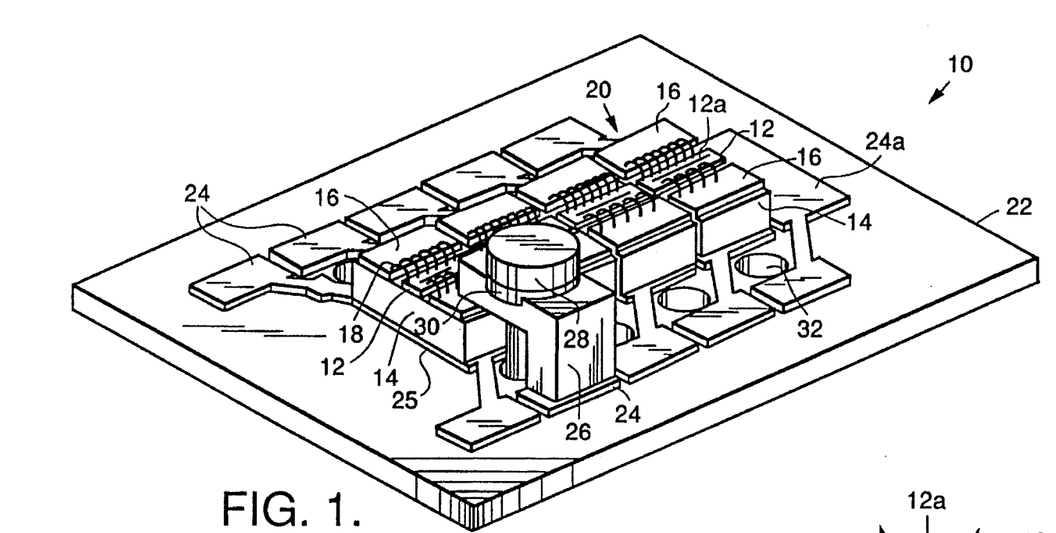
FIG. 1 is an enlarged elevational view of a partially assembled linear array of SE-DFB diode lasers in accordance with an embodiment of this invention.

FIG. 1 is an enlarged elevational view of a partially assembled linear array 10 of SE-DFB diode lasers 12 in accordance with an embodiment of this invention. As can also be seen in FIGS. 3A and 3B, each SE-DFB diode laser 12 has a window 12a through which an output beam is emitted, and is mounted to a surface of a submount 14 (e.g., a smoothed and polished copper block) which provides both heatsinking and electrical conductivity. Suitable dimensions for the submount 14 are 0.22×0.13 by 0.06 inches. Preferably the diode laser 12 is mounted to the surface of the submount 14 with an electrically conductive layer 13, such a layer of indium solder. Mounted on the surface of the submount 14 on both sides of the diode laser 12 are a pair of insulators having a conductive surface layer (e.g., alumina (ceramic) pads 16 having a gold coated surface 17). Conventional wirebonds 18 (e.g., 1–2 mil gold wires) are made from the gold coated ceramic pads 18 to the diode laser 12 to couple operating current to the diode laser.

Figure 3A:
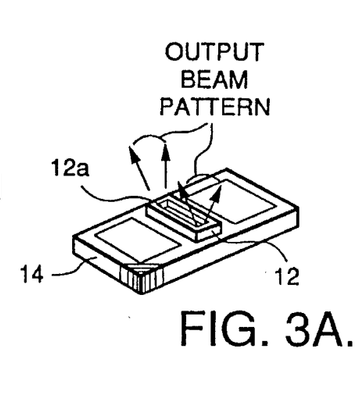
FIG. 3A is an enlarged elevational view of a single SE-DFB diode laser mounted to a thermally and electrically conductive substrate, wherein a longitudinal axis of the diode laser is considered to be taken along and parallel to an output window of the diode laser.
Figure 3B:
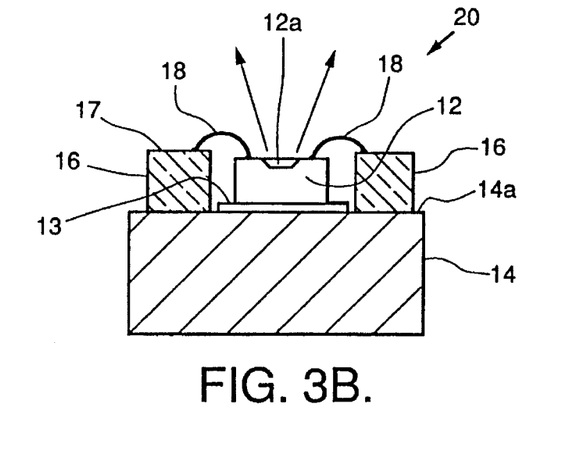
FIG. 3B is an enlarged cross-sectional view through a single SE-DFB diode laser assembly prior to the integration of the assembly into the array of FIG. 1.

It should be appreciated that the structure illustrated in cross-section in FIG. 3A forms a completed diode laser subassembly 20 that is capable of being tested and burned-in prior to being integrated into the array 10. In this manner the completed array can be assured to have all diode lasers that are functional and that meet the required specifications.

After testing and burning in individual ones of the subassemblies 20 the subassemblies are mounted to an electrically insulating substrate 22 that has patterned metal for making electrical contact to individual ones of the subassemblies 20. By example, the subassemblies 20 are mounted to a BeO substrate 22 that has patterned metal pads 24 and 24a. In other embodiments of the invention the substrate 22 can be comprised of diamond, $Al_2O_3$, or any suitable electrically insulating material that exhibits a sufficient amount of thermal conductivity.

Preferably, a layer 25 of compliant electrically and thermally conductive material is interposed between each of the subassemblies 20 and the metal pad 24a which lies under the subassembly. One presently preferred compliant material is indium foil having a thickness of, by example, 5 mils. The use of the compliant indium foil is beneficial during the optical alignment process, as will be described below with respect to FIGS. 5A–5B and FIG. 6.

Figure 9:
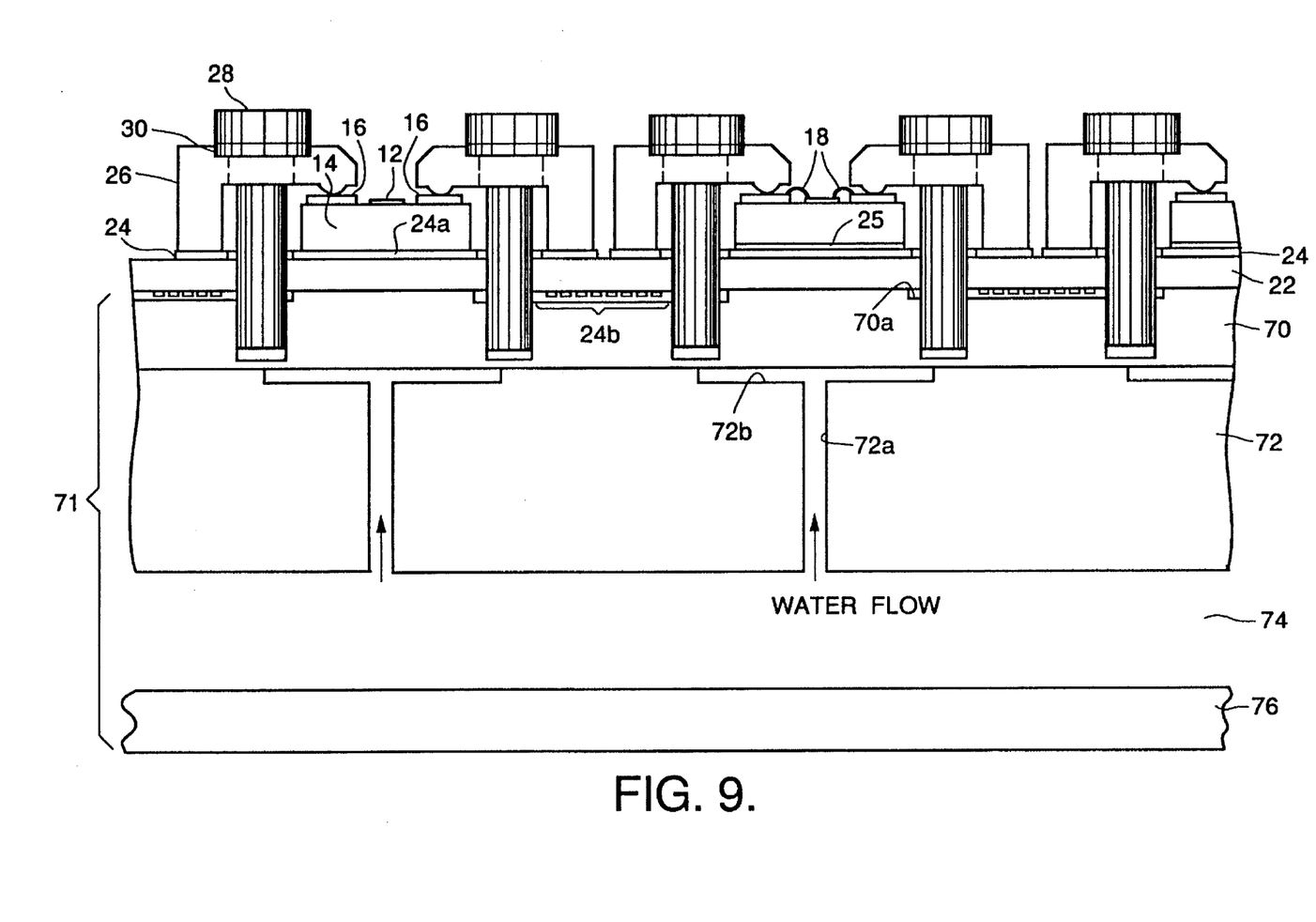
FIG. 9 is a cross-sectional view through a portion of a two-dimensional SE-DFB diode laser array assembly.

A pair of electrically conductive clamps 26 (only one of which is shown in FIG. 1) are employed to hold each of the subassemblies 20 to the underlying electrical pads 24a. Screws 28 are fitted with electrically insulating collars 30 and pass through suitably positioned apertures 32 within the substrate 22. The screws 28 are threaded into a copper plate 70 as is shown in FIG. 9. The screws 28 are tightened to provide the compressive force necessary to form a low resistance electrical contact.

When the screw 28 is suitably tightened an electrical connection is made from a pad 24 through the clamp 26, through the conductive coating 17 and wirebond 18, through the diode laser 12 and out the conductive (+) back surface of the diode laser 12, through the indium solder 13, through the copper block of the submount 14, through the indium foil layer 25, and to the underlying conductive pad 24a.

Figure 10A:
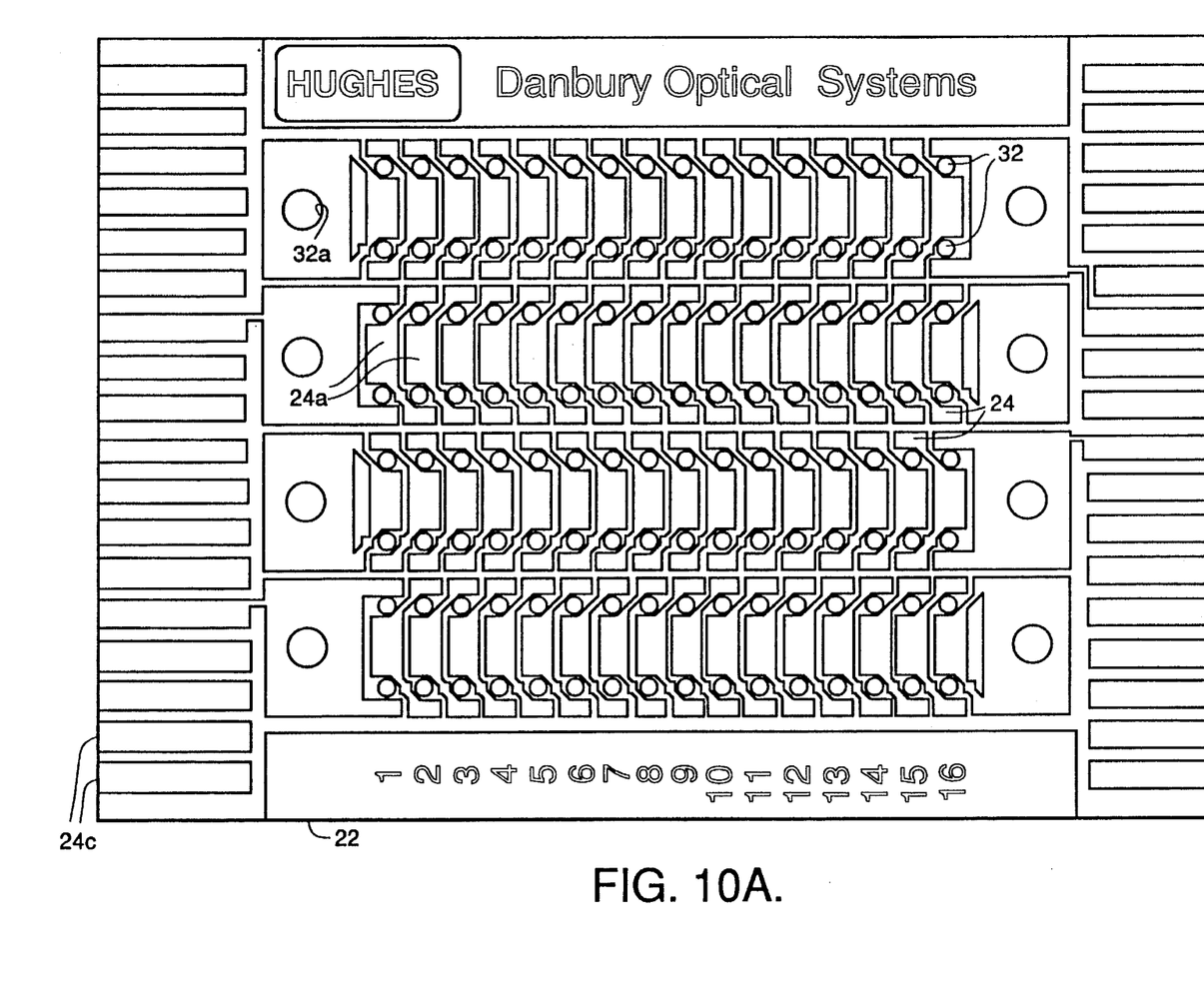
FIGS. 10A and 10B illustrate exemplary patterns of circuit traces for interconnecting a plurality (i.e., 64) of discrete SE-DFB diode lasers in a series, voltage adding two dimensional array, while also providing access to individual ones of the diode lasers.
Figure 10B:
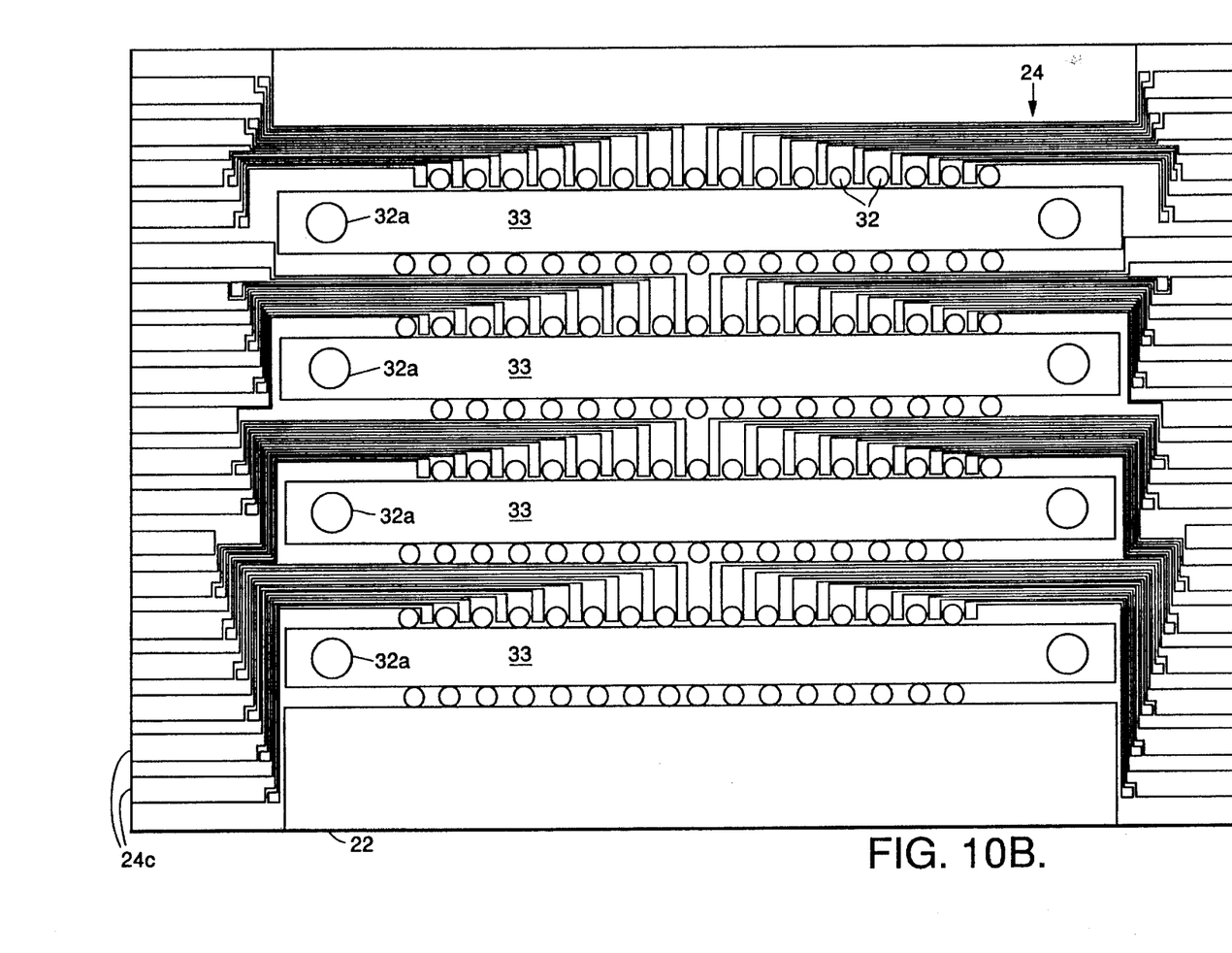

Referring also to the two dimensional array case of FIGS. 10A–10B, the patterned metal on the substrate 22 is formed such that the clamps 26 bring an electrical connection from the bottom (positive electrical connection) of one diode laser 12 to the top (negative electrical connection) of a next adjacently disposed diode laser 12, thereby connecting the diode lasers in series. The negative electrical connection is made from the conductive coating 17 and through the wire bonds 18.

Figure 2:
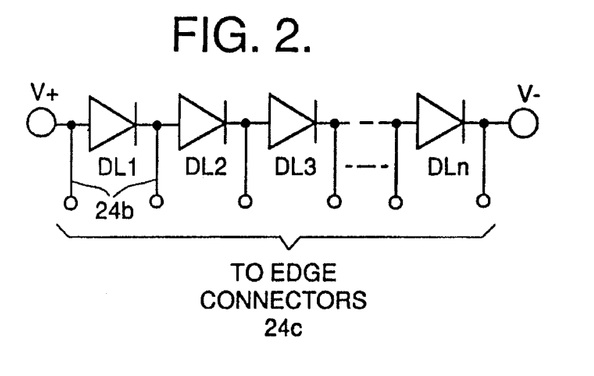
FIG. 2 is a schematic diagram illustrating a plurality of series connected, voltage adding diode lasers.

FIG. 2 is a schematic diagram showing a plurality (DL1–DLn) of diode lasers that are connected in a series, voltage adding configuration in accordance with FIGS. 1, 10A and 10B. A positive supply lead (V+) is coupled to the anode of a first diode laser while the negative supply lead (V−) is coupled to the cathode of a last diode laser.

Although it may appear at first glance that such a series connected array of laser diodes would be undesirable if one of the diode lasers were to fail, it has been established that the primary failure mode for such diode lasers is an electrically shorted condition. As a result, the shorting out of one or more of the diode lasers does not open the current carrying path and does not disable the entire array.

Further in accordance with an aspect of this invention, the metallization is arranged on the substrate 22 so as to provide for individual ones of the diode lasers 12 to be separately energized via traces 24b and edge connectors 80 (FIG. 11) that are coupled to electrically conductive fingers 24c on the substrate 22 (see FIGS. 10A–10B). The energizing of individual ones of the diode lasers 12 is beneficial during the testing and optical alignment of the completed array. The selective energizing of individual ones of the diode lasers 12 (either singularly or in groups) is also beneficial when it is desired to provide a variable optical output power from the array, and also when it is desired to provide different wavelength outputs from the array. For example, each of the diode lasers 12 can have the same output wavelength (e.g., a wavelength in the range of 0.75 to 1.5 microns), or each one or groups of diode lasers can be selected to have different output wavelengths. Providing different output wavelengths is useful in wavelength multiplexing and other wavelength-dependent applications.

Figure 4A:
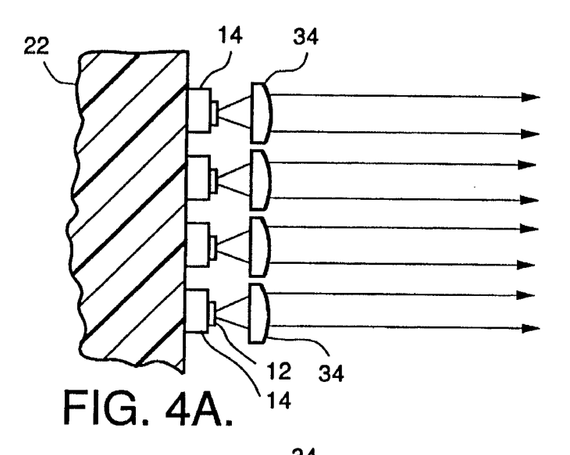
Figure 4B:
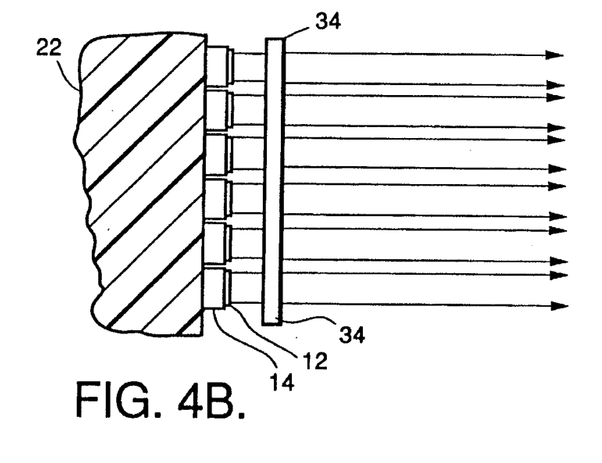
FIG. 4B is a side view taken normal to the longitudinal axis of the plurality of in-line SE-DFB diode lasers, wherein both views illustrate the use of a single cylindrical lens to collimate the output beams from the plurality of in-line SE-DFB diode lasers.

Referring to FIGS. 4A and 4B, in conjunction with FIG. 3A, it is preferred to provide a collimating lens, such as a cylindrical lens 34, for collimating the output beams of a plurality of linearly disposed diode lasers 12. A single cylindrical lens can collimate the output beams of an entire line of SE-DFB diode lasers due to the essentially collimated output beam along the longitudinal axis of the diode lasers 12, the longitudinal axis being parallel to the long axis of the window 12a. In this regard it is noted that if edge-emitting Fabry-Perot lasers are used instead, a separate collimating lens would most likely be provided for each diode laser.

Reference is now made to FIGS. 5A–5B, FIG. 6, FIGS. 7A–7D, and FIG. 8 for illustrating aspects of this invention concerned with the alignment of the completed array 10.

Figure 5A:
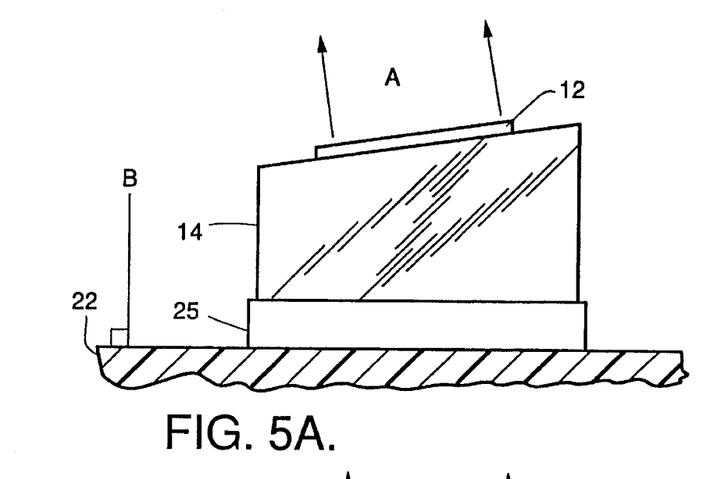
Figure 5B:
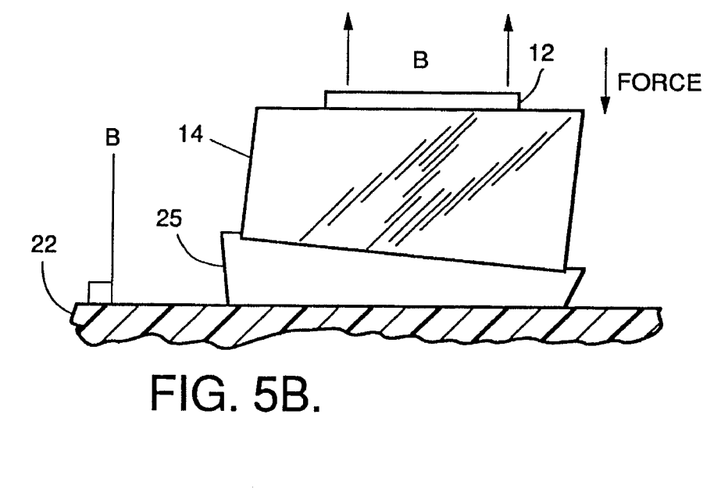
FIG. 5B is a side view of the SE-DFB diode laser after the optical alignment process.

FIG. 5A is a simplified side view of a single SE-DFB diode laser assembly 20, mounted on the layer 25 of compliant material (e.g., indium foil) before an optical alignment process, while FIG. 5B is a side view of the SE-DFB diode laser assembly 20 after the optical alignment process. In FIG. 5A the assembly 20 has some associated wedge or tilt which results in the output beam A being misaligned with respect to an optical axis B, here taken to be normal to the surface of the substrate 22. To remove the tilt a tool (not shown) is employed to engage the edges of the submount 14 and to controllably press the submount 14 into the compliant layer 25 of indium foil. The indium foil flows under pressure (as is well known) and thus enables the submount 22 to be aligned so as to make the output beam A parallel to the optical axis B (FIG. 5B). To facilitate the performance of this procedure, and referring briefly to FIG. 3B, it is preferred to mount the insulating pads 16 so as to leave exposed an outer portion of the top surface of the submount 14, thereby forming a ledge 14a that can be grasped by the alignment tool. Using this technique as much as approximately 5 to 10 milliradians of tilt can be removed from the mounted subassembly 20.

Figure 6:
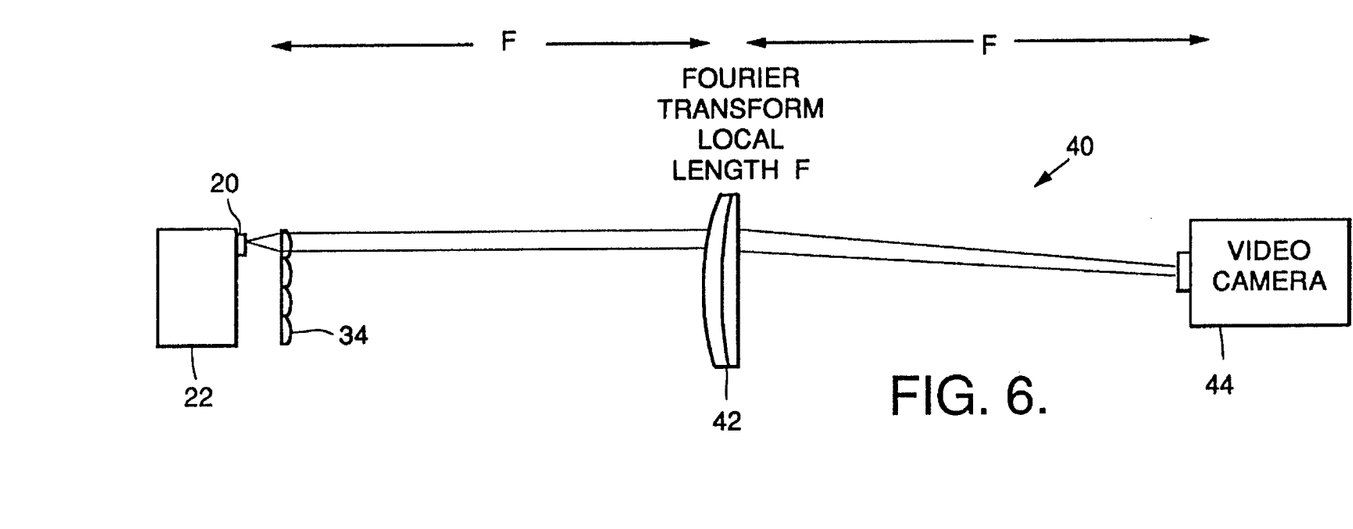
FIG. 6 is a simplified block diagram of a diode laser array optical alignment system, the alignment system including a video camera for imaging a focused output beam that emanates from a single diode laser of the array.

The alignment process is accomplished with an alignment system 40 shown in simplified form in FIG. 6. A Fourier transform lens 42 is positioned one focal length from the diode laser array/cylindrical lens combination under test and one focal length from a radiation sensitive surface of a video camera 44. The Fourier transform lens 42 operates to convert small tilt angles of individual ones of the diode lasers 12 into displacements of a spot image 46 in an image 44a obtained with the video camera 44 (FIGS. 7A–7B).

Figure 7A:
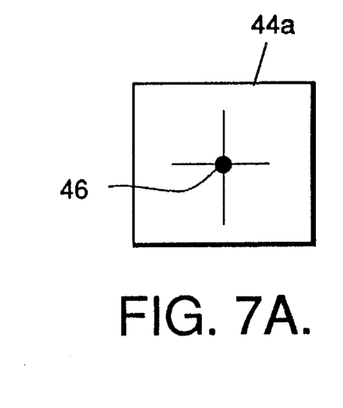
FIG. 7A illustrates a diode laser that is correctly aligned.
Figure 7B:
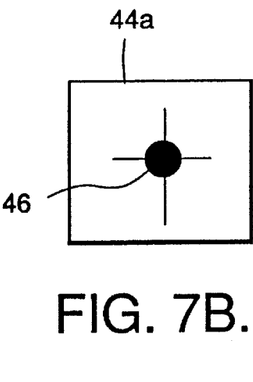
FIG. 7B illustrates the effect of a focussing misalignment.
Figure 7C:
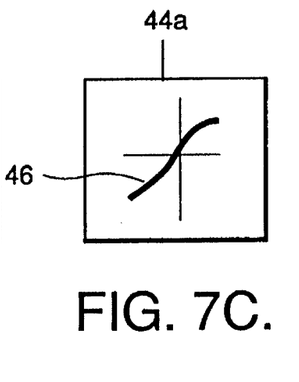
FIG. 7C illustrates an effect of an angular misalignment between the longitudinal axis of a SE-DFB diode laser and a longitudinal axis of the cylindrical collimating lens.
Figure 7D:
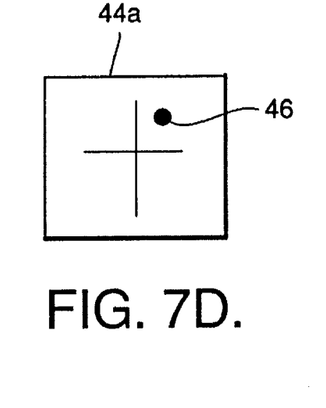
FIG. 7D illustrates a wedge-induced (tilt) misalignment.

FIG. 7A illustrates the spot image 46 for a diode laser 12 that is correctly aligned. Alignment is referenced to a set of crosshairs that are superimposed on the image 44a. FIG. 7B illustrates the effect of a focussing (piston) misalignment on the spot image 46. FIG. 7C illustrates an effect of an angular misalignment between the longitudinal axis of a SE-DFB diode laser 12 and a longitudinal axis of the cylindrical lens 34. FIG. 7D illustrates a wedge-induced (tilt) misalignment, as shown in FIG. 5A. The misalignments illustrated in FIGS. 7B–7D can all be corrected by physically moving the subassembly 20 under test, in cooperation with the underlying compliant layer 25 of indium foil, while observing the image 44a obtained from the video camera 44.

The alignment process can also be used to detect diode laser subassemblies that are shorted to adjacent subassemblies.

Preferably the diode laser of the subassembly 20 under test is operated in a pulsed mode during the test. In this case a pulse of DC current having a typical width of 200 nanoseconds and a pulse repetition rate of $10^3$ pulses/second is sufficient to obtain a suitable image for alignment purposes. During the alignment process the separate edge finger connections (FIG. 2) are employed to sequentially pulse the diode lasers 12. When the optical alignment of one subassembly 20 is completed the pulsing is terminated and another subassembly is tested.

Figure 8:
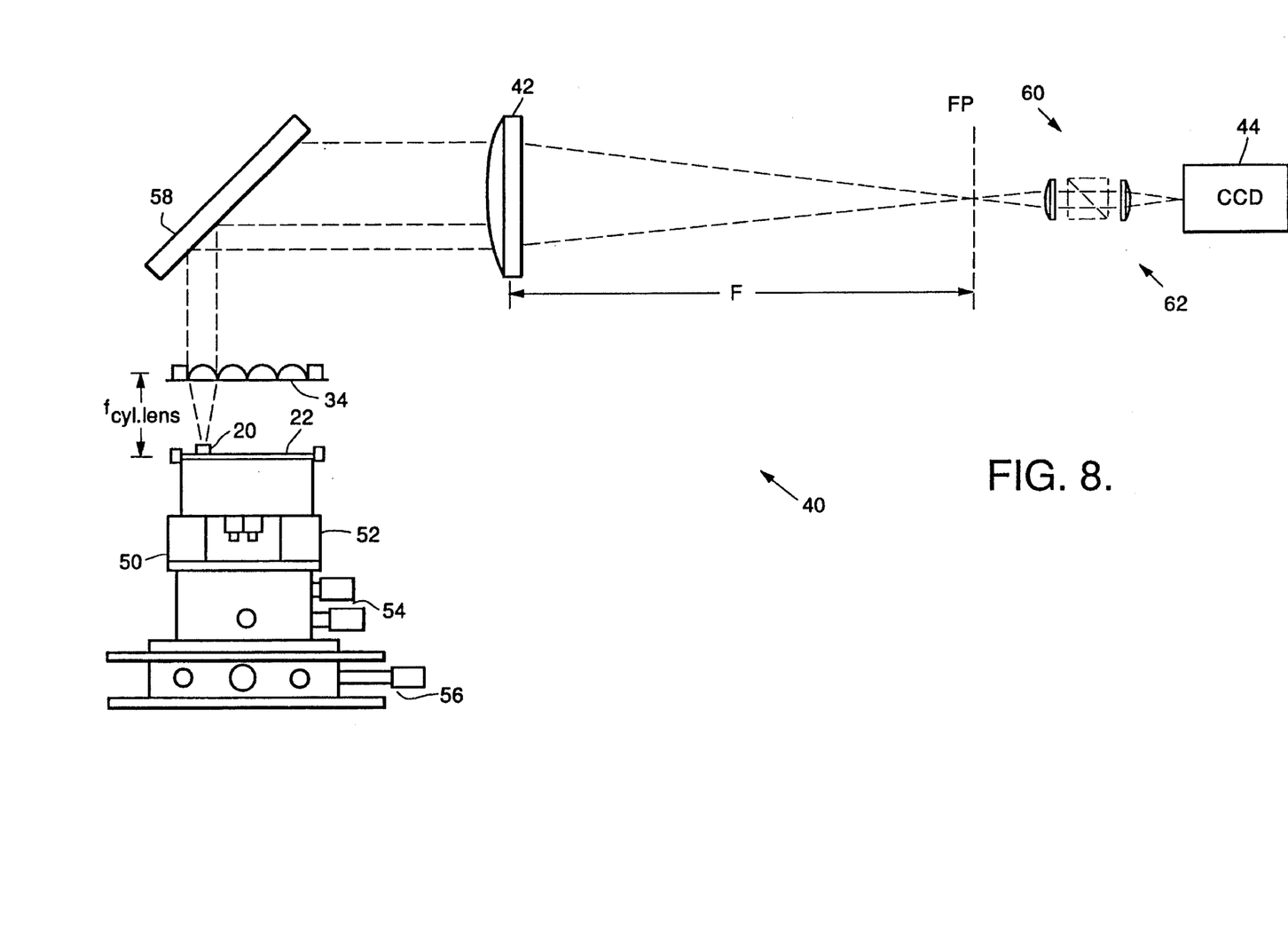
FIG. 8 is a block diagram that illustrates the optical alignment system of FIG. 6 in greater detail.

Reference is now made to FIG. 8 which shows in greater detail an embodiment of the alignment system 40. The substrate 22 having the subassemblies 20 is mounted to a riser block 50 and a power oscillator module 52. The power oscillator module 52 is used for pulsing individual ones of the diode lasers 12 through a suitable switching circuit (not shown). The power oscillator module 52 and riser block 50 are mounted to a multiple degree of freedom positioning mechanism comprised of a tilt/rotation stage 54 that is mounted to a two-axis translation stage 56. Stages 54 and 56 are used for establishing an initial gross alignment of the planar surface of the substrate 22 to the optical axis of the alignment system 40. The cylindrical lens array 34 is positioned a working distance $f_{cyl.lens}$ (e.g., 40 mm) from the substrate 22. A fold mirror 58 directs the collimated output beam from a single diode laser 12 to the Fourier transform lens 42, which in turn focuses the collimated beam to a point on a focal plane (FP). Located behind the focal plane is an imaging system 60 (magnification of 1) which includes a beam splitter 62. The output of the imaging system 60 is provided to the video camera 44 which includes a CCD element that is responsive to the wavelength(s) of the diode lasers 12 under test. The beam splitter 62 enables an alignment laser (e.g., a red HeNe laser) to be co-located so as to facilitate an interferometric initial alignment of the substrate 22, via the stages 54 and 56.

When properly aligned, all of the diode lasers 12 in the array will focus and overlap onto a single spot position in the video camera image. As was indicated above with respect to FIGS. 7B–7D, a tilt in the beam will register as a displacement of the spot image 46 from the correct position. A misfocus is indicated as an enlargement of the spot image 46. If the cylindrical lens 34 is angled with respect to the diode laser 12 then the spot image 46 will be deformed into an s-shape.

During the alignment process the alignment tool simultaneously adjusts the longitudinal tilt angle and seats the submount 14 into the indium foil layer 25. The foil layer 25 can be squeezed several tens of microns during seating. It is thus possible to also remove small focus errors. The alignment tool thus provides the force required to compress and flow the underlying indium layer 25. After aligning the diode laser subassembly the clamp 26 is engaged with sufficient force to hold the diode laser subassembly in place, without causing further compression and flowing of the indium layer 25.

FIG. 9 is a cross-sectional view through a portion of a two-dimensional SE-DFB diode laser array assembly, and illustrates the relationship of a water cooled heat sink assembly 71 to the substrate 22. The completed array assembly includes, in addition to the structures discussed previously with respect to FIG. 1, the heat sink assembly 71 which is comprised of the above-mentioned copper plate 70 that is mounted to the back surface of the substrate 22 by the clamp screws 28. In most applications the array is operated in a continuous wave (cw) or continuous duty mode, (i.e., using direct current). In this case the heat load is large and fluid cooling is preferred. The BeO substrate 22 has electrically floating copper buses 33 on the bottom side which can be soldered to the plate 70 to provide a path having a low thermal resistance. The copper plate 70 has recesses 70a formed in the surface adjacent to the substrate 22, the recesses 70a providing clearance for the metal traces 24b on the back surface of the substrate 22 (see FIG. 10B).

On the opposite surface of the copper plate 70 is a second copper plate 72 having channels 72a and recesses 72b through which is flowed a cooling fluid (e.g., water). The water flow is to and from a water channel 74 that is formed between a lower surface of the copper plate 72 and a bottom surface or plate 76. An O-ring (not shown) is provided for insuring a water-tight seal.

FIGS. 10A and 10B illustrate exemplary metallized patterns for a 64-element diode laser array in accordance with this invention. The preferred design uses copper on BeO (known as 'direct bonded copper' (DBC)) which exhibits excellent thermal conductivity and can accommodate a large surface current with negligible resistive power loss. The DBC metallization is lapped and polished to provide an optically flat/smooth surface to facilitate the initial alignment of the laser diode/submount and to improve the heat transfer characteristics. The preferred design includes the use of vias (small copper feed-throughs from the top surface of the BeO to the bottom surface). Apertures 32a provide an ability to top-side mount a shorting bus bar (not shown) with non-conductive screws through the apertures 32a. In this manner a single power supply can provide power to the entire array. Alternatively, separate power supplies can be used to power each linear array of diode lasers that make up the two dimensional array. In this case the shorting bus bars are not mounted with the apertures 32a. The bottom-side metallization includes the traces 24b that are brought to edge fingers 24c, and which enable individual ones of the diode lasers 12 to be separately energized during alignment and, if desired, during operation.

Figure 11:
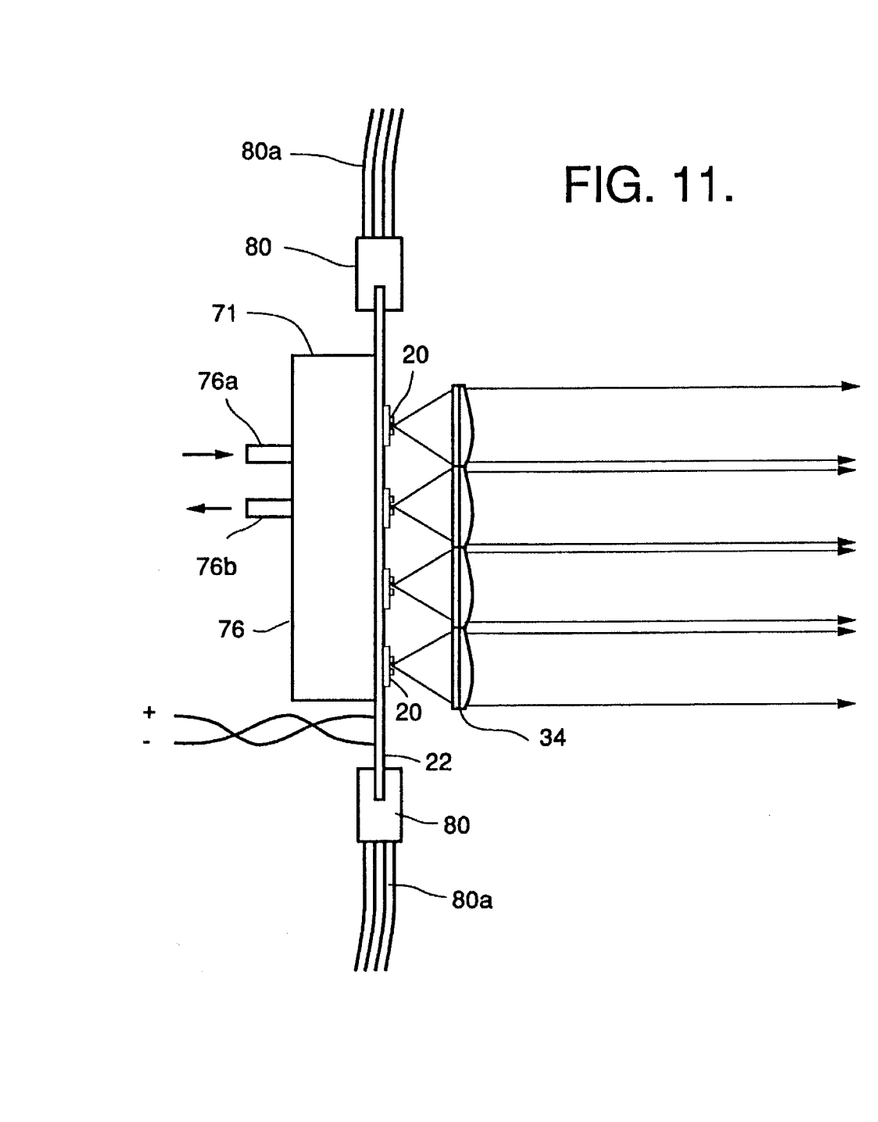
FIG. 11 is a side view of a completed two dimensional SE-DFB diode laser array assembly in accordance with this invention.

Referring to FIG. 11, the fingers 22c along opposing edges of the substrate 22 fit a standard edge card connector 80 having associated cabling 80a. It is thus possible to make an electrical connection to one diode laser 12 at a time. Power leads 82 bring in electrical power from at least one power supply (not shown) when it is desired to simultaneously power the entire array. The water cooled heat sink assembly 71 is provided with conduits 76a and 76b through the back surface or plate 76 for establishing a flow of cooling fluid through the heat sink assembly 71.

The 64 element diode laser array assembly shown in FIG. 11 is capable of providing, by example, 300 W of collimated optical energy.

While the invention has been particularly shown and described with respect to preferred embodiments thereof, it will be understood by those skilled in the art that changes in form and details may be made therein without departing from the scope and spirit of the invention.

By example, the indium foil layer 25 could be replaced with a thin layer of a soft metal alloy (e.g., an indium alloy), or with a thin layer of optical compound, such as a silicone-based compound having a zinc oxide stabilizer. In this latter case it is assumed that sufficient contact area will exist between the submount 14 and the underlying metallization 24a to provide the required electrical conductivity. Also by example, the DBC metallization could be replaced with vapor deposited and electroplated metallization, or with any metal system that provides a desired amount of optical flatness and current carrying capability. Furthermore, the teaching of this invention applies equally to both linear (one dimensional) and area (two dimensional) arrays of diode lasers, and is not limited in scope to any specific number of diode lasers that may comprise the array. Further by example, the array need not be operated in the cw (continuous duty) mode, but can be operated in a pulsed mode, or can be operated one laser or row of lasers at a time.

What is claimed is:

1. An array of diode lasers, comprising:

a substrate having a plurality of electrically conductive surface areas; and a plurality of diode laser subassemblies individual ones of which are conductively coupled to one of said plurality of surface areas each of said diode laser subassemblies comprising a diode laser that is conductively coupled to and mounted upon a first surface of an electrically conductive body, said electrically conductive body having a second opposite surface that is electrically coupled to and mounted upon one of said electrically conductive areas, wherein said substrate further includes a plurality of electrical conductors for connecting together said diode lasers in series.

2. An array of diode lasers as set forth in claim 1 wherein said electrically conductive body is electrically coupled to and mounted upon said one of said electrically conductive areas with a layer of compliant, deformable material that provides electrical and thermal conductivity between said electrically conductive body and said electrically conductive area.

3. An array of diode lasers as set forth in claim 2 wherein said layer of compliant, deformable material is comprised of indium.

4. An array of diode lasers as set forth in claim 1 wherein said first surface of said electrically conductive body has mounted thereon at least one electrical insulator having an electrically conductive portion, and further comprising a plurality of wirebonds electrically coupled between said electrically conductive portion and said diode laser.

5. An array of diode lasers as set forth in claim 1 and further comprising a fluid cooled heat sink assembly that is thermally coupled to a surface of said substrate that is opposite a surface to which said subassemblies are mounted.

6. An array of diode lasers as set forth in claim 1 wherein a predetermined number of said subassemblies are arranged in a linear pattern, and further comprising a lens disposed for collimating an output beam from individual ones of said diode lasers associated with the predetermined number of subassemblies.

7. An array of diode lasers as set forth in claim 6 wherein said lens is a cylindrical lens.

8. An array of diode lasers as set forth in claim 1 wherein individual ones of said diode lasers all emit electromagnetic radiation with the same wavelength.

9. An array of diode lasers as set forth in claim 1 wherein at least one of said diode lasers emits electromagnetic radiation with a wavelength that differs from a wavelength emitted by others of said diode lasers.

10. An array of diode lasers as set forth in claim 1 wherein each of said diode lasers is a surface emitting diode laser having a window through which an output beam is emitted.

11. An array of diode lasers as set forth in claim 1 wherein each of said diode lasers is a surface emitting distributed feedback diode laser having a window through which an output beam is emitted.

12. An array of diode lasers comprising:

a substrate having a plurality of electrically conductive surface areas; and a plurality of diode laser subassemblies individual ones of which are conductively coupled to one of said plurality of surface areas, each of said diode laser subassemblies comprising a diode laser that is conductively coupled to and mounted upon a first surface of an electrically conductive body, said electrically conductive body having a second opposite surface that is electrically coupled to and mounted upon one of said electrically conductive areas; and for each of said subassemblies, at least one electrically conductive clamping member for compressively urging said electrically conductive body towards said substrate and for coupling a current flow to said diode laser.

13. An array of diode lasers as set forth in claim 12 wherein said substrate further includes a plurality of electrical conductors for connecting to individual ones of said diode lasers such that a current flow can be established through a single diode laser.

14. An array of diode lasers as set forth in claim 12 wherein said electrically conductive body is electrically coupled to and mounted upon said one of said electrically conductive areas with a layer of compliant, deformable material that provides electrical and thermal conductivity between said electrically conductive body and said electrically conductive area.

15. An array of diode lasers as set forth in claim 12 wherein said layer of compliant, deformable material is comprised of indium.

16. An array of diode lasers as set forth in claim 12 wherein said first surface of said electrically conductive body has mounted thereon at least one electrical insulator having an electrically conductive portion, and further comprising a plurality of wirebonds electrically coupled between said electrically conductive portion and said diode laser.

17. An array of diode lasers as set forth in claim 12 and further comprising a fluid cooled heat sink assembly that is thermally coupled to a surface of said substrate that is opposite a surface to which said subassemblies are mounted.

18. An array of diode lasers as set forth in claim 12 wherein a predetermined number of said subassemblies are arranged in a linear pattern, and further comprising a lens disposed for collimating an output beam from individual ones of said diode lasers associated with the predetermined number of subassemblies.

19. An array of diode lasers as set forth in claim 12 wherein each of said diode lasers is a surface emitting diode laser having a window through which an output beam is emitted.

20. An array of diode lasers as set forth in claim 12 wherein each of said diode lasers is a surface emitting distributed feedback diode laser having a window through which an output beam is emitted.

* * * * *